United States Patent
Yamaji et al.

(10) Patent No.: US 7,613,577 B2
(45) Date of Patent: Nov. 3, 2009

(54) ONBOARD BATTERY MONITORING APPARATUS AND METHOD FOR CORRECTING OFFSET VALUE OF CURRENT SENSOR THEREOF

(75) Inventors: Shigeo Yamaji, Toyota (JP); Toshiyuki Asakura, Toyota (JP)

(73) Assignee: Yazaki Corporation, Tokyo (JP)

( * ) Notice: Subject to any disclaimer, the term of this patent is extended or adjusted under 35 U.S.C. 154(b) by 369 days.

(21) Appl. No.: 11/445,269

(22) Filed: Jun. 2, 2006

(65) Prior Publication Data
US 2006/0273762 A1 Dec. 7, 2006

(30) Foreign Application Priority Data
Jun. 3, 2005 (JP) ............................ P2005-164554

(51) Int. Cl.
*G01R 31/36* (2006.01)
(52) U.S. Cl. ............................ 702/63; 702/58; 324/426; 324/435
(58) Field of Classification Search .................. 324/426, 324/435; 702/58, 63
See application file for complete search history.

(56) References Cited

U.S. PATENT DOCUMENTS

| | | | | |
|---|---|---|---|---|
| 6,621,250 B1 * | 9/2003 | Ohkubo et al. | ............... | 320/136 |
| 7,268,532 B2 * | 9/2007 | Ishishita et al. | ......... | 324/117 R |
| 2004/0138836 A1 | 7/2004 | Ishishita et al. | | |

FOREIGN PATENT DOCUMENTS

| | | |
|---|---|---|
| DE | 19947301 C1 | 7/2001 |
| DE | 60313566 T2 | 2/2008 |
| JP | 2004-177187 A | 6/2004 |
| JP | 2004-325235 A | 11/2004 |
| JP | 2005091185 A * | 4/2005 |

* cited by examiner

*Primary Examiner*—Edward Tso
*Assistant Examiner*—Ramy Ramadan
(74) *Attorney, Agent, or Firm*—Sughrue Mion, PLLC

(57) ABSTRACT

An onboard battery monitoring apparatus for monitoring charging and discharge currents of an onboard battery 40 using a current sensor 43 includes an ignition switch 49, a main line current interrupting unit 41 for interrupting a current of a main line A which constitutes a monitoring target to be monitored by the current sensor, a detecting unit 51 for detecting an output of the current sensor 43 when the ignition switch 49 is off and the main line current interrupting unit 41 is interrupting the current, and an offset value correcting unit 51 for correcting an offset value of the current sensor 43 using a value detected by the detecting unit 51. Since an output of the current sensor 43 resulting when a current to be measured by the current sensor 43 is 0 ampere is detected as an offset value, an offset value can be obtained in which a change in characteristics attributed to the tolerance and/or aging of the current sensor 43 is reflected, thereby making it possible to accurately correct the offset value of the current sensor 43.

3 Claims, 5 Drawing Sheets

ONBOARD BATTERY MONITORING APPARATUS AND METHOD FOR CORRECTING OFFSET VALUE OF CURRENT SENSOR THEREOF

BACKGROUND OF THE INVENTION

1. Field of the Invention

The present invention relates to an onboard battery monitoring apparatus which monitors the charged state of a battery installed on a vehicle such as a motor vehicle and a method for correcting an offset value of a current sensor which is used in the monitoring apparatus, the apparatus and method being intended to increase the measuring accuracy for charging and discharge currents of onboard batteries.

2. Description of the Related Art

In motor vehicles produced in recent years, various types of electronic devices are installed, and the fuel injection amount of an engine is also controlled by a computer. In these circumstances, in case the amount of residual charged current in an onboard battery which supplies power to those electronic devices becomes short, a serious problem with the operation of a vehicle occurs. On the other hand, in order to realize the reduction in load placed on the engine so as to increase the fuel economy of the vehicle, it is required to reduce wasteful power generation by an alternator which charges the onboard battery.

In order to control the power generation accurately, it is necessary to be aware of an accurate charged state of the battery, and to this end, an onboard battery monitoring apparatus is provided which detects a discharge current which flows out of the battery (a discharge amount) and a charging current which flows into the battery (a charging amount) by a current sensor and estimates the charged state of the battery from an integrated value from the discharge amount and the charging amount so detected.

The current sensor is made up of, for example, a ring core having a gap, a lead wire which passes through a ring of the ring core and a Hall element inserted in the gap of the ring core, so that a pass current which flows through the lead wire is measured by metering a magnetic flux density that is produced by the pass current.

A measured value that is measured by the current sensor contains an error attributed to the offset thereof. This results from the tolerance of the current sensor and/or aging of the current sensor and/or its peripheral circuits and devices. Due to this, in the onboard batter monitoring apparatus, the offset value of the current sensor is corrected properly.

There is known an onboard battery monitoring apparatus having a function to adjust the offset of a current sensor (for example, refer to JP-A-2004-325235). This onboard battery monitoring apparatus includes, as shown in FIG. 5, a battery 1, a current sensor 21, an ignition switch (hereinafter, referred to an "ignition switch" or "IG●SW") 7 and a plurality of electronic control units (hereinafter, referred to as "ECEs") 31, 11, 13, 15, and one ECU 31 of these ECUs executes the offset adjustment of the current sensor 21. The ECUs 11, 13, 15 are ECUs for controlling an engine, door locks, air conditioner, audio devices and the like.

The ECU 31 has a communication state determination unit 35D, an acquisition unit 35A for acquiring an offset adjusting timing, an output obtaining unit 35B for obtaining an output from the current sensor 21 at an offset adjusting timing so acquired and an adjustment value determination unit 35C for determining on an offset adjusting value.

In this apparatus, when the driving power supply from the battery 1 to the ECUs 11, 13, 15 is stopped with the IG●SW 7 off, the operation of switches, not shown, which connect to the ECUs 11, 13, 15 is not performed, and control signals to loads to be controlled (not shown) are not produced, resulting in a state where no control signal is transmitted and received between the ECUs 11, 13, 15 via a LAN 9.

As this occurs, only a dark current flows to the ECUs 11, 13, 15 and the controlled loads, and only a discharge current made up of the dark current and a current that is supplied to the ECU 31 flows on a power supply line 3. The amount of the discharge current is a minute value which is negligible enough in offset adjustment of the current sensor 21.

The communication state determination unit 35D detects a state where no multiplex communication is performed on the LAN 9, the acquisition unit 35A acquires a state detected by the communication determination unit 35D as an "offset adjustment condition satisfying state," and the output obtaining unit 35B obtains an output outputted from the current sensor 21 when the acquisition unit 35A acquires the offset adjustment condition satisfying state. The adjustment value determination unit 35C determines a difference between the output of the current sensor 21 then and an output of the current sensor 21 in a standard characteristic when there is no current flowing on the power supply line 3.

In the motor vehicles produced in recent years, however, there are installed a security system which continues to its detecting operation even when the engine is stopped, entertainment equipment which can give the occupant enjoyment even while the vehicle is parked and the like, and hence, there are installed components in which consumed current (dark current) is changed and which are driven directly through the operation of switches by the occupant, even though the multiplex communication on the LAN is stopped. Due to this, even though the offset value of the current sensor is corrected by selecting a state where the multiplex communication is stopped, it is hard to carry out an accurate correction and is not possible to correct accurately a change in characteristics attributed to the tolerance and/or aging of the current sensor.

SUMMARY OF THE INVENTION

The invention was made in view of the situations, and an object thereof is to provide an onboard battery monitoring apparatus which can accurately correct the offset value of the current sensor and a method for accurately correcting the offset value of the current sensor.

With a view to accomplishing the object, according to the invention, an onboard battery monitoring apparatus will be provided according to respective aspects (1) to (3) of the invention as below.

(1) According to a first aspect of the invention, there is provided an onboard battery monitoring apparatus for monitoring charging and discharge currents of an onboard battery using a current sensor, including:

an ignition switch;

a main line current interrupting unit for interrupting a current of a main line which constitutes a monitoring target to be monitored by the current sensor;

a detecting unit for detecting an output of the current sensor when the ignition switch is off and the main line current interrupting unit is interrupting the current; and an offset value correcting unit for correcting an offset value of the current sensor using a value detected by the detecting unit.

(2) According to a second aspect of the invention, there is provided an onboard battery monitoring apparatus as set forth in (1) above, including further:

a side line which allows a current of the main line to bypass the main line current interrupting unit and the current sensor so as to flow thereinto; and a side line current interrupting unit for interrupting a current flowing into the side line; wherein when the ignition switch is on, the side line current interrupting unit interrupts the current to the side line, while when the detecting unit detects an output of the current sensor, the side line current interrupting unit allows the current to flow into the side line.

(3) According to a third aspect of the invention, there is provided an onboard battery monitoring apparatus as set forth in (1) above, wherein the main line current interrupting unit continues to interrupt the current flow to the main line even after a correction of the offset value by the offset correcting means is completed.

According to the configuration described in (1) above, since an output of the current sensor resulting when a current to be measured by the current sensor is 0 ampere is detected as an offset value, an offset value can be obtained in which a change in characteristics attributed to the tolerance and/or aging of the current sensor is reflected.

In addition, according to the configuration described in (2) above, since the current flows to the load through the side line even when the current is interrupted which flows to the current sensor to detect an offset value of the current sensor, no effect is imposed on the load.

Additionally, according to the configuration described in (3) above, since the dark current is interrupted by the main line current interrupting unit, the onboard battery can be prevented from becoming flat (that is, the overdischarge of the onboard battery) even when the vehicle is kept at rest for a long period of time, thereby making it possible to improve the startability of the engine. In addition, an accident attributed to a short circuit can be prevented while the vehicle is serviced.

In addition, with a view to accomplishing the aforesaid object, a method for correcting an offset value of a current sensor of an onboard battery monitoring apparatus will be provided according to respective aspects (4), (5) of the invention.

(4) According to a fourth aspect of the invention, there is provided a method for correcting an offset value of an onboard battery monitoring apparatus which monitors charging and discharge currents of an onboard battery using a current sensor, the method including:

a first step of causing a current of a main line which constitutes a monitoring target to be monitored by the current sensor to branch off so as to flow into a side line which bypasses the current sensor when an ignition switch is switched off;

a second step of interrupting a current of the main line which flows to the current sensor;

a third step of detecting an output of the current sensor;

a fourth step of correcting an offset value of the current sensor using a value detected in the third step;

a fifth step of releasing the interruption of the current to the main line; and a sixth step of interrupting the current flowing into the side line.

(5) A method for correcting an offset value of an onboard battery monitoring apparatus which monitors charging and discharge currents of an onboard battery using a current sensor, the method including:

a first step of detecting an output of the current sensor when an ignition switch is switched off and a current of a main line which flows to the current sensor is interrupted;

a second step of correcting an offset value of the current sensor using a value detected in the first step; and a third step of stopping a current monitoring operation by the current sensor.

According to the method described in (4) above, since the current flows only into the sideline and an output of the current sensor resulting when the current on the main line that is to be measured by the current sensor is 0 is detected as an offset value, an offset value can be obtained in which a change in characteristics attributed to the tolerance and/or aging of the current sensor is reflected. In addition, no effect is imposed on the load by the interruption of the current to the main line.

According to the method described in (5) above, since an output of the current sensor resulting when the current to be measured by the current sensor is interrupted is detected as an offset value, an offset value can be obtained in which a change in characteristics attributed to the tolerance and/or aging of the current sensor is reflected. In addition, since the interruption of dark current continues even after the correction of the offset value has been completed, the onboard battery can be prevented from becoming flat even though the vehicle is kept at rest for a long period of time, and the startability of the engine can be improved. In addition, an accident attributed to a short circuit can be prevented while the vehicle is serviced.

According to the invention, even though a change in characteristics attributed to the tolerance and/or aging occurs in the current sensor used in the onboard battery monitoring apparatus, the offset value of the current sensor can be corrected accurately. Due to this, the current measuring accuracy of the onboard battery monitoring apparatus can be increased, so as to accurately calculate an amount of residual charged current in the onboard battery, whereby a wasteful power generation in charging the onboard battery can be reduced, so as to realize a reduction in fuel consumption.

Thus, the invention has been briefly described heretofore. Details of the invention will be clarified further by perusing the following best mode for carrying out the invention by reference to the accompanying drawings.

DESCRIPTION OF THE PREFERRED EMBODIMENTS

First Embodiment

Figure 1:
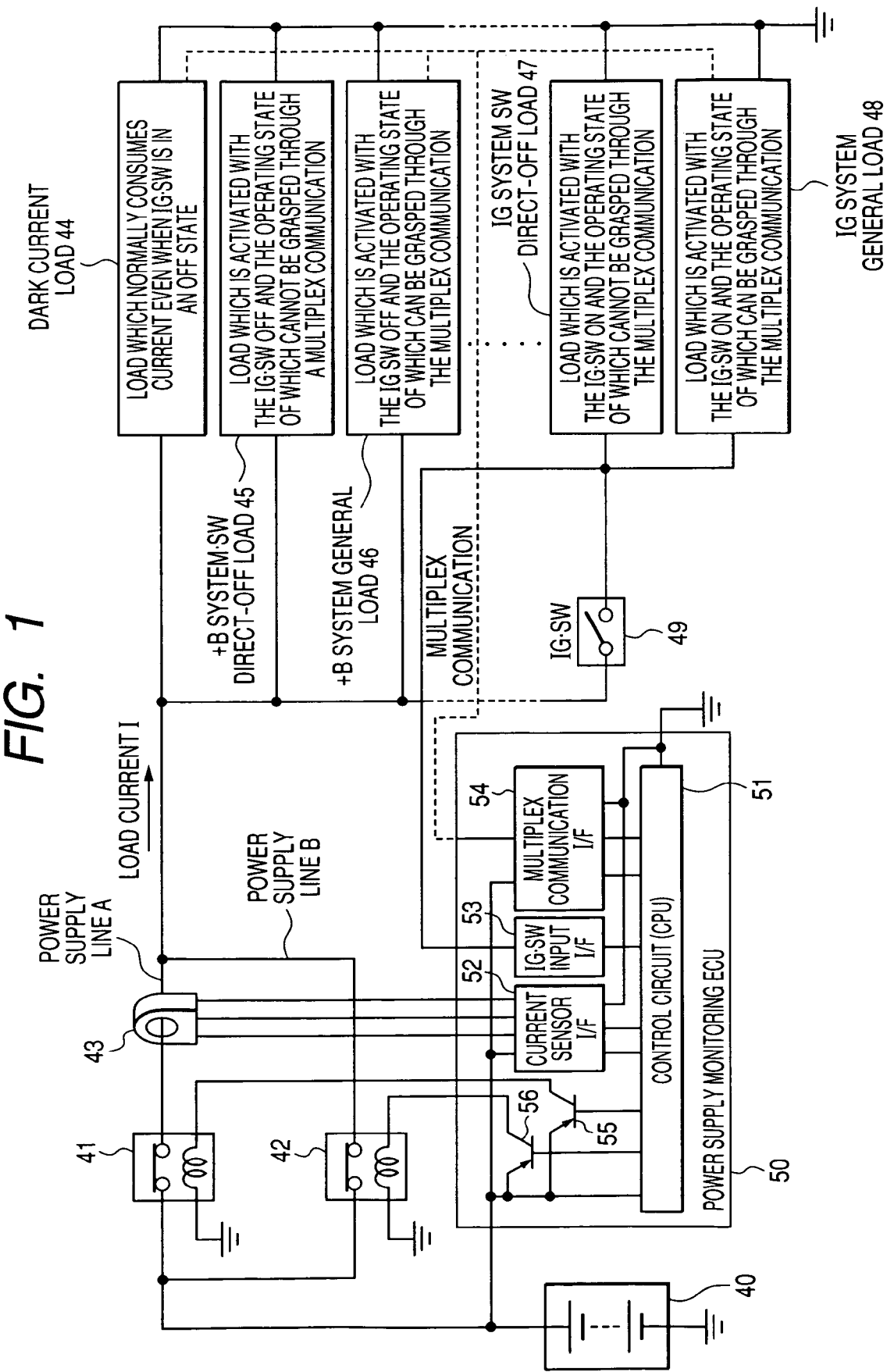
FIG. 1 is a block diagram which shows the configuration of a first embodiment of an onboard battery monitoring apparatus according to the invention.

FIG. 1 is a block diagram which shows the configuration of a first embodiment of an onboard battery monitoring apparatus according to the invention. This onboard battery monitoring apparatus includes an onboard battery 40, a current sensor 43, a primary relay 41, which is normally closed, a secondary relay 42, which is normally open, an IG●SW 49, a power supply monitoring ECU 50 for adjusting an offset value of the current sensor 43 by controlling the primary relay 41 and the secondary relay 42, and various types of loads 44 to 48.

Here, to describe further, the various types of loads are divided into a "dark current load" 44 which normally consumes dark current even with the IG●SW 49 off, a "+B system SW direct-off load" 45 which is activated with the IG●SW 49 off and the operating state of which cannot be grasped through a multiplex communication on an onboard LAN, a "+B system general load" 46 which is activated with the IG●SW 49 off and the operating state of which can be grasped through the multiplex communication on the onboard LAN, an "IG system SW direct-off load" 47 which is activated with the IG●SW 49 on and the operating state of which cannot be grasped through the multiplex communication on the onboard LAN, and an "IG system general load" 48 which is activated with the IG●SW 49 on and the operating state of which can be grasped through the multiplex communication on the onboard LAN. The dark current load 44, the +B system general load 46 and the IG system general load 48 are connected to the onboard LAN. Note that the "+B system" denotes a back-up system (namely, a system to which a battery voltage is supplied even with the IG●SW 49 off).

The primary relay 41 is disposed between the current sensor 43 and the onboard battery 40 in such a manner as to make on/off a current on a current supply line A which constitutes a pass current of the current sensor 43. The secondary relay 42 is disposed on a current supply line B which bypasses the current sensor 43 in parallel with the primary relay 41 in such a manner as to make on/off a current on the current supply line B.

A load current I, which is normally sent via the current supply line A, is supplied from the onboard battery 40 to the dark current load 44, the +B system direct-off load 45 and the +B general load 46 and is also supplied to the IG system direct-off load 47 and the IG system general load 48 via the IG●SW 49.

The power monitoring ECU 50 includes a multiplex communication interface (I/F) 54 which connects to the onboard LAN, an IG●SW input I/F 53 to which a signal indicating an on/off state of the IG●SW 49 is inputted, a current sensor I/F 52 which connects to the current sensor 43, a primary transistor 55 which makes off the primary relay 41 which is normally closed, a secondary transistor 56 which makes on the secondary relay 42 which is normally open, and a control circuit (CPU) 51 which corrects an offset value of the current sensor 43, and the current is normally supplied from the onboard battery 40 to the individual units of the power supply monitoring ECU 50 except for the IG●SW input I/F 53.

The CPU 51 of the power supply monitoring ECU 50 detects an output of the current sensor 43 and corrects an offset value thereof during a process of correcting the offset of the current sensor 43. Namely, the CPU 51 of the power supply monitoring ECU 50 functions as the "detecting means for detecting an output of the current sensor" and the "offset value correcting means for correcting the offset value of the current sensor using a value detected by the detecting means" which are so defined in the claims of the invention.

In this apparatus, the primary relay 41 which is normally closed is kept on at all times except when the offset value of the current sensor 43 is corrected, and all the load current I flows through the current supply line A.

Figure 2:
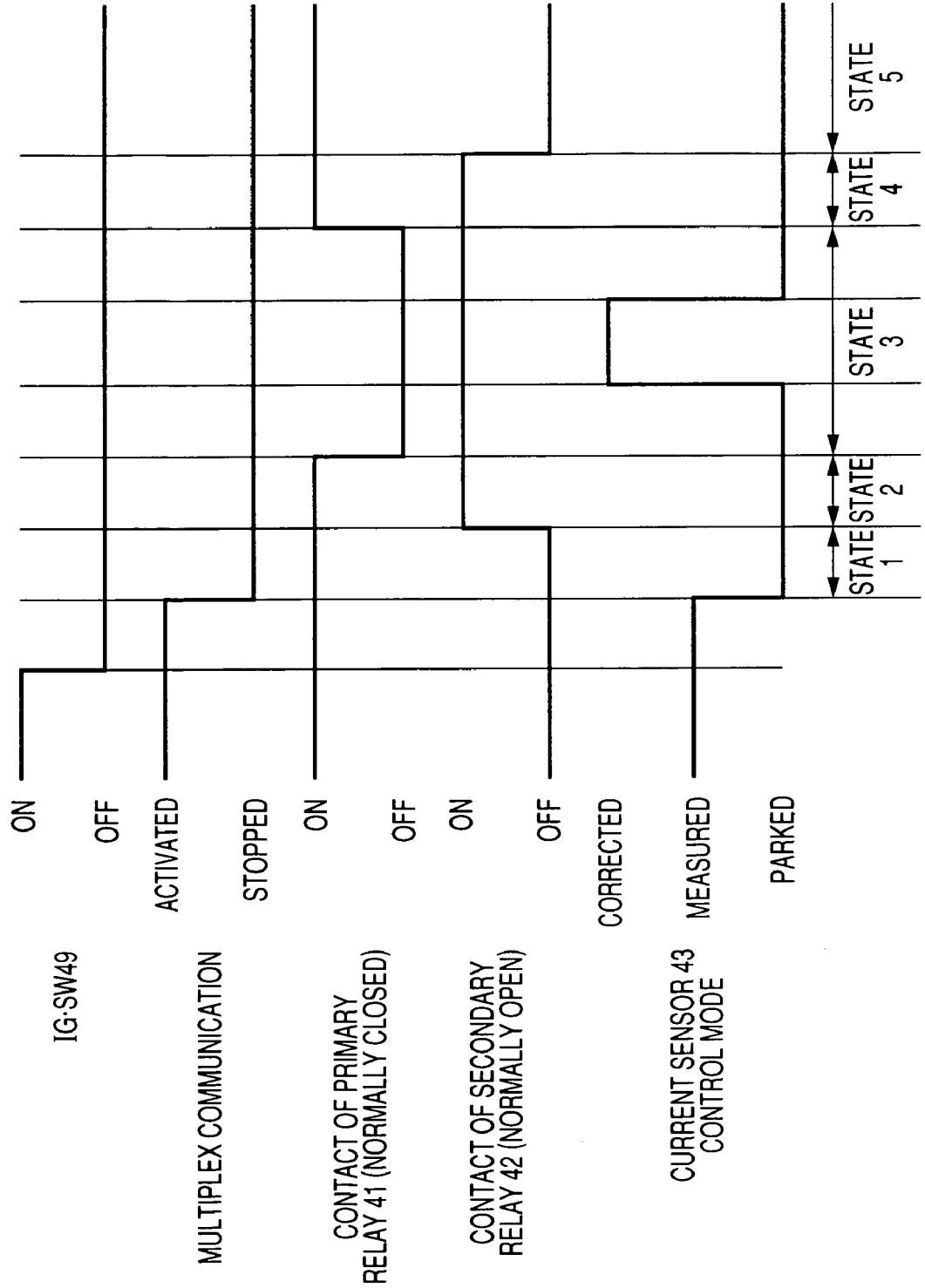
FIG. 2 is a timing chart which illustrates an offset value correcting method used in the first embodiment of the onboard battery monitoring apparatus according to the invention.

The adjustment of the offset value of the current sensor 43 will be carried out in the following procedure. FIG. 2 is a timing chart which illustrates operation timings occurring during this offset value adjustment.

(1) The user parks the vehicle and switches off the IG●SW 49. When detecting from a signal obtained through the IG●SW input I/F 53 that the IG●SW 49 is in the off state, the CPU 51 changes modes of the current sensor 43 from a measuring mode to a park controlling mode. In addition, the CPU 51 of the power supply monitoring ECU 50 detects from a signal obtained through the multiplex communication I/F 54 that a multiplex communication on the onboard LAN is in a stopped state.

When there occurs the aforesaid state or a state 1 in which the IG●SW 49 is in the off state, the multiplex communication in the stopped state and the current sensor 43 in the park controlling mode, the CPU 51 of the power supply monitoring ECU 50 starts a process of correcting the offset value of the current sensor 43.

(2) Firstly, the CPU 51 of the power supply monitoring ECU 50 energizes the secondary transistor 56 so as to make the secondary relay 42 on to thereby allow the load current I to flow into both the current supply line A and the current supply line B. Consequently, a state 2 is produced in which the IG●SW 49 is in the off state, the multiplex communication in the stopped state, the current sensor 43 in the park controlling mode, the primary relay 41 in the on state, and the secondary relay 42 in the on state.

(3) Following this, the CPU 51 of the power supply monitoring ECU 50 energizes the primary transistor 55 so as to make the primary relay 41 off to thereby allow the load current 1 to flow only into the current supply line B. Consequently, a state 3 is produced in which the IG●SW 49 is in the off state, the multiplex communication in the stopped state, the current sensor 43 in the park controlling mode, the primary relay 41 in the off state, and the secondary relay 42 in the on state.

In this state 3, since no current flows into the current supply line A, the pass current of the current sensor 43 becomes 0 ampere. The CPU 51 detects an output of the current sensor 43 then and corrects the offset value of the current sensor 43 to the value so detected.

(4) Having completed the correction of the offset value of the current sensor 43, the CPU 51 of the power supply monitoring ECU 50 de-energizes the primary transistor 55 so as to restore the primary relay 41 to the on state (a state 4). This state 4 is a state identical to the state 2.

(5) Then, the CPU 51 of the power supply monitoring ECU 50 de-energizes the secondary transistor 56 so as to restore the secondary relay 42 to the off state (a state 5). This state 5 is a state identical to the state 1.

Thus, the offset value correcting process of the current sensor 43 is completed. During the offset value correcting process, since the onboard battery 40 and the loads 44 to 46 are connected to each other through the current supply line B, the loads 44 to 46 are not affected even though the current supply line A is cut off.

As has been described heretofore, in the onboard battery monitoring apparatus of the embodiment, since the offset value is corrected in such a state that the pass current of the current sensor 43 is 0 ampere, the change in output of the current sensor attributed to the variability of tolerance and/or aging of the current sensor can be corrected accurately.

As a result, the current measuring accuracy of the onboard battery monitoring apparatus can be increased, so as to accurately calculate an amount of residual charged current in the onboard battery 40, whereby a wasteful power generation in charging the onboard battery can be reduced, so as to realize a reduction in fuel consumption.

Second Embodiment

Figure 3:
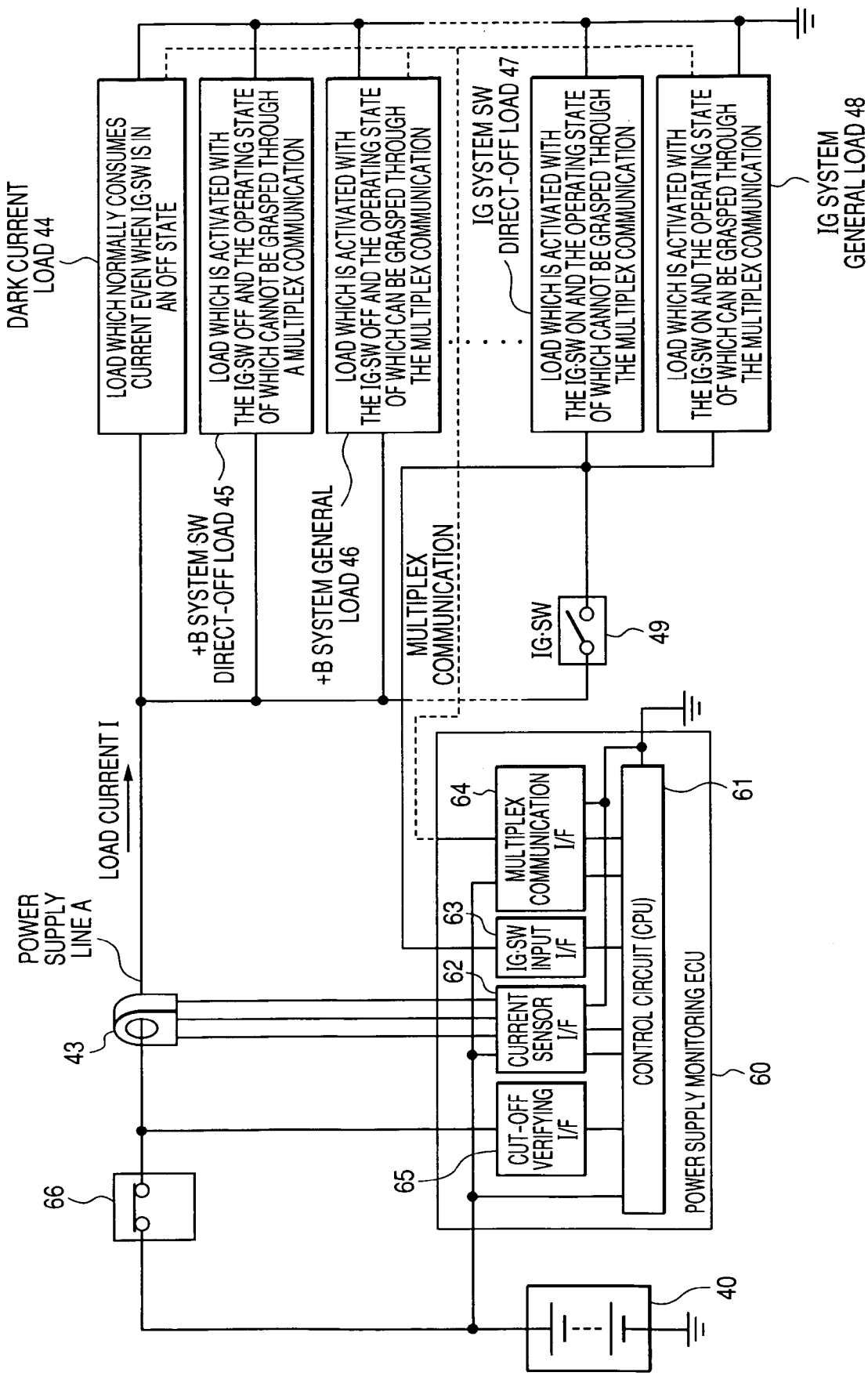
FIG. 3 is a block diagram which shows the configuration of a second embodiment of an onboard battery monitoring apparatus according to the invention.

FIG. 3 is a block diagram which shows the configuration of a second embodiment of an onboard battery monitoring apparatus according to the invention. Note that like reference numerals will be imparted to like constituent elements of the second embodiment to those of the first embodiment that has just been described, so as to simplify or omit the description thereof.

As shown in FIG. 3, this onboard battery monitoring apparatus includes an onboard battery 40, a current sensor 43, a power supply cut-off device 66 for making on/off a current on a current supply line A, an IG●SW 49, a power supply monitoring ECU 60 for adjusting an offset value of the current sensor 43 and various types of loads 44 to 48.

The power supply cut-off device 66 is such as to make on/off a current on the current supply line A which constitutes a pass current of the current sensor 43 and hence is disposed between the current sensor 43 and the onboard battery 40, so as to be operated by the user to cut a power supply to the various loads 44 to 48 when the vehicle is stopped.

The power supply monitoring ECU 60 includes a multiplex communication I/F 64 which connects to an onboard LAN, an IG●SW input I/F 63 to which a signal indicating an on/off state of the IG●SW 49 is inputted, a cut-off verifying I/F 65 to which a signal indicating an on/off state of the power supply cut-off device 66 is inputted and a control circuit (CPU) 61 for correcting an offset value of the current sensor 43, and current is normally supplied from the onboard battery 40 to the individual units of the power supply monitoring ECU 60 except for the IG●SW input I/F 63 and the cut-off verifying I/F 65.

The CPU 61 of the power supply monitoring ECU 60 detects an output of the current sensor 43 and corrects an offset value thereof during a process of correcting the offset of the current sensor 43. Namely, the CPU 61 of the power supply monitoring ECU 60 functions as the "detecting means for detecting an output of the current sensor" and the "offset value correcting means for correcting the offset value of the current sensor using a value detected by the detecting means" which are so defined in the claims of the invention.

The onboard battery 40, the current sensor 43, the IG●SW 49 and the various types of loads 44 to 48 do not differ from those of the first embodiment in any way (namely, remain the same).

In this apparatus, when the user parks the vehicle and cuts off the power supply to the various type of loads 44 to 48 by operating the power supply cut-off device 66, an offset adjustment by the current sensor 43 is started.

Figure 4:
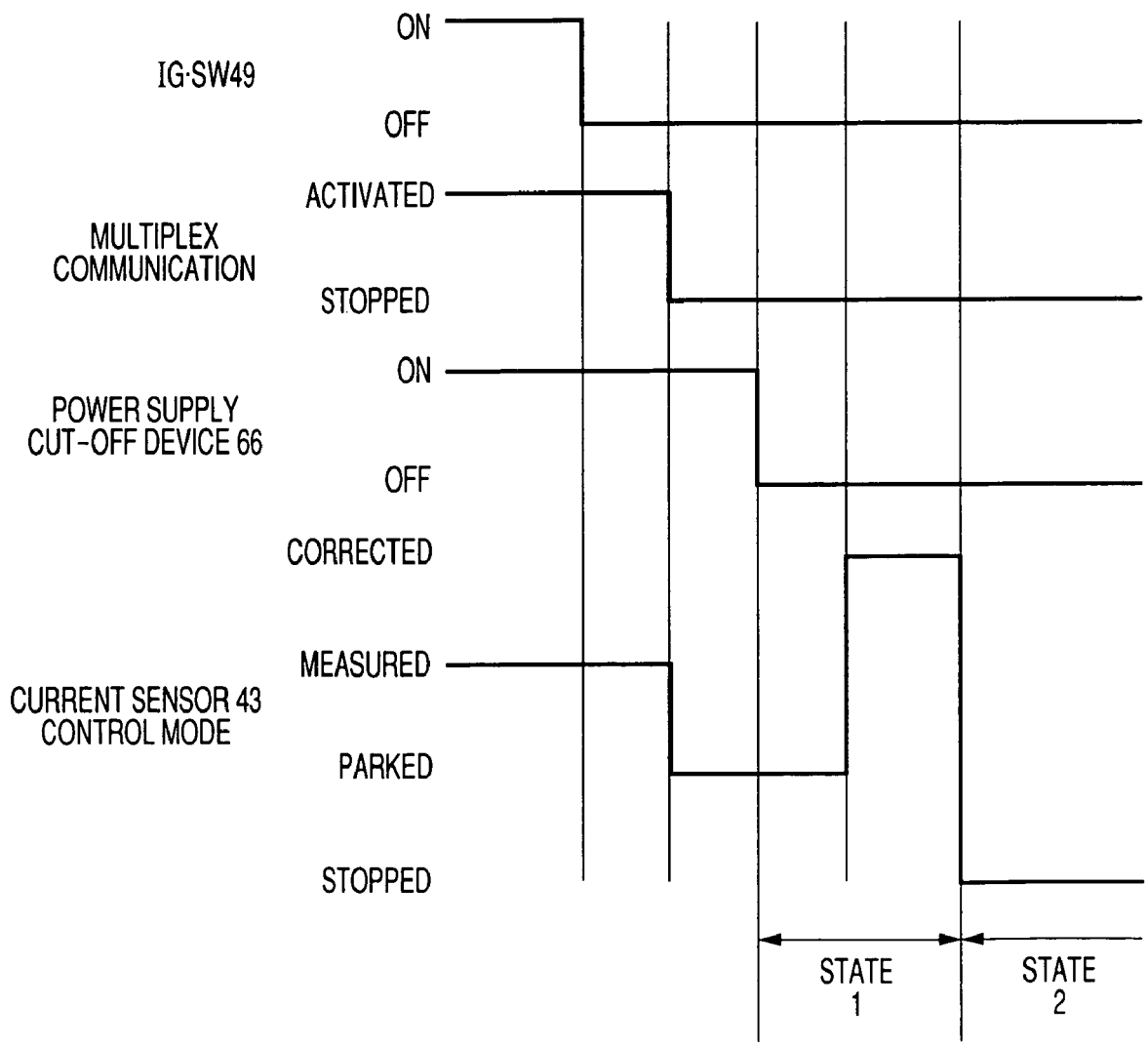
FIG. 4 is a timing chart which illustrates an offset value correcting method used in the second embodiment of the onboard battery monitoring apparatus according to the invention.
Figure 5:
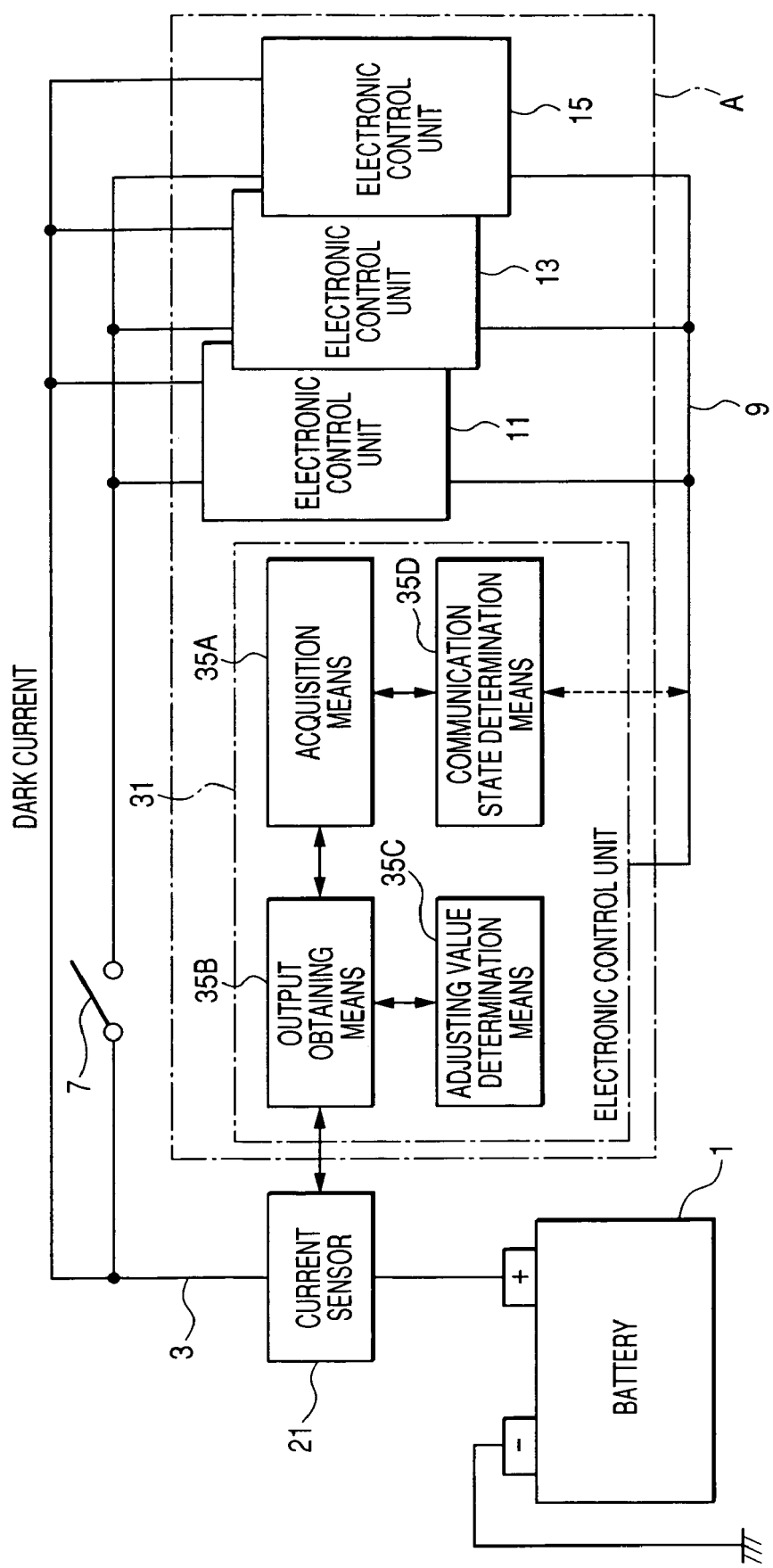
FIG. 5 is a block diagram which shows the configuration of a conventional onboard battery monitoring apparatus.

FIG. 4 shows a timing chart which illustrates operation timings occurring during this offset value adjustment. Namely, the adjustment of the offset value of the current sensor 43 will be carried out in the following procedure.

(1) When detecting from a signal obtained through the IG●SW input I/F 63 that the IG●SW 49 is in the off state, the CPU 61 changes modes of the current sensor 43 from a measuring mode to a park controlling mode. In addition, the CPU 61 of the power supply monitoring ECU 60 detects from a signal obtained through the multiplex communication I/F 64 that a multiplex communication on the onboard LAN is in a stopped state. Additionally, the CPU 61 of the power supply monitoring ECU 60 verifies from a signal obtained through the cut-off verifying I/F 65 that the power supply cut-off device 66 is switched from on to off when the user operates the power supply cut-off device 66.

When there occurs the aforesaid state or a state 1 in which the IG●SW 49 is in the off state, the multiplex communication in the stopped state, the current sensor 43 in the park controlling mode and the power supply cut-off device 66 in the off state, the CPU 61 of the power supply monitoring ECU 60 starts a process of correcting the offset value of the current sensor 43.

In this state 1, since no current flows into the current supply line A, the pass current of the current sensor 43 becomes 0 ampere. The CPU 61 detects an output of the current sensor 43 then and corrects the offset value of the current sensor 43 to the value so detected.

(2) When the correction of the offset value of the current sensor 43 is completed, the CPU 61 stops the measuring of current by the current sensor 43. Consequently, a state 2 is produced in which the IG●SW 49 is in the off state, the multiplex communication in the stopped state, the power supply cut-off device 66 in the off state, and the current sensor 43 in a stop mode.

The offset value correcting process of the current sensor 43 is completed in this way.

As has been described heretofore, in the onboard battery monitoring apparatus of the embodiment, since the offset value is corrected in such a state that the pass current of the current sensor 43 is 0 ampere, the change in output of the current sensor attributed to the variability of tolerance and/or aging of the current sensor can be corrected accurately.

In addition, since the interruption of dark current continues to be carried out by the power supply cut-off device 66 even after the offset value correcting process has been completed, the onboard battery can be prevented from becoming flat (that is, the overdischarge of the onboard battery 40) even though the vehicle is kept at rest for a long period of time, and the startability of the engine can be improved. In addition, an accident attributed to a short circuit can be prevented while the vehicle is serviced.

Thus, as has been described heretofore, according to the invention, it is possible to increase the monitoring accuracy of the onboard battery monitoring apparatus which monitors the charging and discharge of the onboard battery, and hence, the invention can be widely applied to onboard battery monitoring apparatuses on various types of vehicles.

What is claimed is:

1. An onboard battery monitoring apparatus for monitoring charging and discharge currents of an onboard battery, comprising:
an ignition switch;
main line current interrupter coupled between the onboard battery and the ignition switch, which main line current interrupter interrupts a current of a main line;
a current sensor disposed between the main line current interrupter and the ignition switch, which current sensor monitors the current of the main line and provides an output value of the current in the main line being interrupted between the onboard battery and the ignition switch;

a detector, which detects the provided output value of the current sensor when the ignition switch is off and the main line current interrupter is interrupting the current; and an offset value corrector, which corrects an offset value of the current sensor using the output value detected by the detector.

2. An onboard battery monitoring apparatus for monitoring charging and discharge currents of an onboard battery using a current sensor, the apparatus comprising:

an ignition switch;

a main line current interrupter interrupting a current of a main line which constitutes a monitoring target to be monitored by the current sensor;

a detector detecting an output value of the current sensor when the ignition switch is off and the main line current interrupter is interrupting the current;

an offset value corrector correcting an offset value of the current sensor using the output value detected by the detector;

a side line, which allows a current of the main line to bypass the main line current interrupter and the current sensor so as to flow thereinto; and a side line current interrupter, interrupting a current flowing into the side line; wherein when the ignition switch is on, the side line current interrupter interrupts the current to the side line, while when the detector detects an output of the current sensor, the side line current interrupter allows the current to flow into the side line.

3. The onboard battery monitoring apparatus according to claim 1, wherein the main line current interrupter continues to interrupt the current flow to the main line even after a correction of the offset value by the offset corrector is completed.

* * * * *